United States Patent
Watson et al.

(10) Patent No.: US 6,734,947 B2
(45) Date of Patent: May 11, 2004

(54) QUICK CHAMBER SEALS

(75) Inventors: Douglas C. Watson, Campbell, CA (US); Michael Binnard, Belmont, CA (US)

(73) Assignee: Nikon Corporation, Tokyo (JP)

( * ) Notice: Subject to any disclaimer, the term of this patent is extended or adjusted under 35 U.S.C. 154(b) by 143 days.

(21) Appl. No.: 09/760,797

(22) Filed: Jan. 17, 2001

(65) Prior Publication Data

US 2002/0093634 A1 Jul. 18, 2002

Related U.S. Application Data

(60) Provisional application No. 60/249,545, filed on Nov. 17, 2000.

(51) Int. Cl.[7] ............................. G03B 27/52; F16J 15/14
(52) U.S. Cl. ................................... 355/30; 277/590
(58) Field of Search ................... 277/590, 315, 277/594, 637, 638, 913; 355/53, 30, 72, 73; 49/490.1, 465

(56) References Cited

U.S. PATENT DOCUMENTS

| | | | | |
|---|---|---|---|---|
| 5,294,257 A | * | 3/1994 | Kelly et al. | 118/52 |
| 6,042,121 A | * | 3/2000 | Ma et al. | 277/608 |
| 6,278,516 B1 | * | 8/2001 | Miwa et al. | 355/67 |
| 6,325,390 B1 | * | 12/2001 | Sillmon | 277/614 |
| 6,333,775 B1 | * | 12/2001 | Haney et al. | 355/30 |
| 6,445,440 B1 | * | 9/2002 | Bisschops et al. | 355/53 |

* cited by examiner

*Primary Examiner*—Rodney Fuller
*Assistant Examiner*—D. Ben Esplin
(74) *Attorney, Agent, or Firm*—Finnegan, Henderson, Farabow, Garrett & Dunner, LLP

(57) ABSTRACT

A chamber seal device is provided to seal a wafer stage chamber assembly to isolate semiconductor substrates, a wafer stage device, and the process of making semiconductor wafers from an atmospheric condition, so that the resulted wafers have an improved quality and meet certain wafer manufacturing specifications. The wafer stage chamber assembly includes a wafer stage chamber, a top wall and a base frame. The wafer stage chamber assembly is supported by an apparatus frame of an exposure apparatus via a plurality of body supports. The chamber seal device includes one or more o-ring seals positioned in between and surrounding the perimeter of the wafer stage chamber and the top wall, or the wafer stage chamber and the base frame to seal the wafer stage chamber assembly.

21 Claims, 10 Drawing Sheets

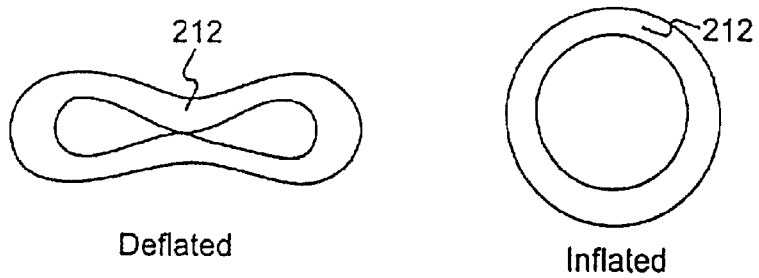
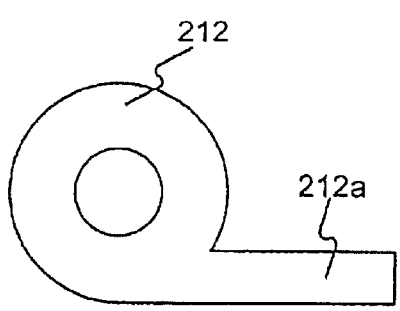
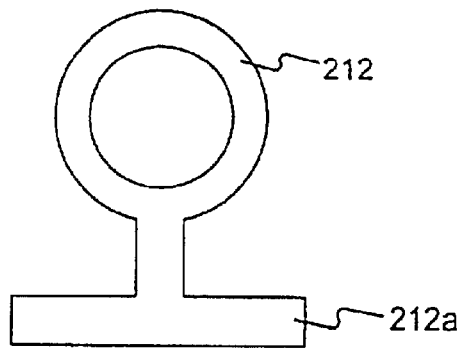
FIG. 4A
FIG. 4B
FIG. 4C
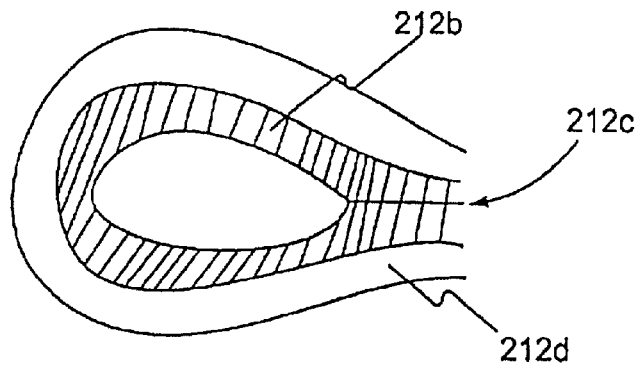
FIG. 4D ns of the multi-layered integrated circuit. Conventional systems use visible and ultraviolet light for this process. Recently, however, visible and ultraviolet light have been replaced with electron, x-ray, and laser beams, which permit smaller and more intricate patterns.

QUICK CHAMBER SEALS

RELATED APPLICATION

This application relies on the benefit of priority of U.S. provisional patent application Serial No. 60/249,545, filed on Nov. 17, 2000.

BACKGROUND OF THE INVENTION

1. Field of the Invention

This invention relates to a quick chamber seal design. More particularly, this invention relates to quick chamber seals for sealing a wafer stage chamber assembly in a photolithography process to manufacture semiconductor wafers.

2. Description of the Related Art

In manufacturing integrated circuits using photolithography, light is transmitted through non-opaque portions of a pattern on a reticle, or photomask, through a projection exposure apparatus, and onto a wafer of specially-coated silicon or other semiconductor material. The uncovered portions of the coating, that are exposed to light, are cured. The uncured coating is then removed by an acid bath. Then, the layer of uncovered silicon is altered to produce one layer of the multi-layered integrated circuit. Conventional systems use visible and ultraviolet light for this process. Recently, however, visible and ultraviolet light have been replaced with electron, x-ray, and laser beams, which permit smaller and more intricate patterns.

As the miniaturization of a circuit pattern progresses, the focus depth of the projection exposure apparatus becomes very small, making it difficult to align accurately the overlay of circuit patterns of the multi-layered integrated circuit. As a result, a primary consideration for an overall design of the photolithography system includes building components of the system that achieve precision by maintaining small tolerances. Any vibration, distortion, or misalignment caused by internal, external or environmental disturbances must be kept at minimum. When these disturbances affect an individual part, the focusing properties of the photolithography system are collectively altered.

In a conventional exposure apparatus of a photolithography system, a wafer stage device is used in combination with a projection lens assembly to manufacture semiconductor wafers. The wafer stage device includes a wafer table to support the wafer substrates, a wafer stage to position the wafer substrates as the wafer stage is being accelerated by a force generated in response to a wafer manufacturing control system, and a wafer stage base to support the wafer stage. The wafer manufacturing control system is the central computerized control system executing the wafer manufacturing process. To permit smaller and more intricate circuit patterns, the projection lens assembly must accurately focus the energy beam to align the overlay of circuit patterns of the multi-layered integrated circuit. The photolithography process of the conventional exposure apparatus is performed with the semiconductor substrates exposed to an atmospheric condition.

A recent development of the photolithography process indicates that the semiconductor substrates need to be processed in a controlled environment which contains a controlled atmosphere, such as nitrogen or helium, to meet certain wafer manufacturing specifications and to improve the quality of the resulted wafers. Therefore, there is a need for a wafer stage chamber design to isolate the semiconductor substrates, the wafer stage device, and the process of making thereof from the atmospheric condition.

SUMMARY OF THE INVENTION

The advantages and purposes of the invention will be set forth in part in the description which follows, and in part will be obvious from the description, or may be learned by practice of the invention. The advantages and purposes of the invention will be realized and attained by the elements and combinations particularly pointed out in the appended claims.

To attain the advantages and consistent with the principles of the invention, as embodied and broadly described herein, a first aspect of the invention is a chamber seal device for sealing a wafer stage chamber assembly of a photolithography system for manufacturing semiconductor substrates. The wafer stage chamber assembly has a first portion and a second portion. The chamber seal device comprises a plurality of pins, at least one keyhole strip, and an o-ring seal. The plurality of pins are aligned on a first flange surrounding a perimeter of the first portion for insertion into a corresponding plurality of openings on a second flange surrounding a perimeter of the second portion. Each of the plurality of pins has a pinhead. The at least one keyhole strip is for insertion into at least a portion of the plurality of pinheads to slidably lock the plurality of pins fastening at least a portion of the first and second flanges to construct the wafer stage chamber assembly. The o-ring seal is positioned in between and surrounding the perimeter of the first and second flanges to seal the wafer stage chamber assembly.

A second aspect of the present invention is a chamber seal device for sealing a wafer stage chamber assembly of a photolithography system for manufacturing semiconductor substrates. The wafer stage chamber assembly has a first portion and a second portion. The chamber seal device comprises at least one clamp channel and at least one o-ring seal. The at least one clamp channel fastens at least a portion of a perimeter of a first flange of the first portion with a corresponding portion of a second flange of the second portion. The at least one o-ring seal is positioned in between and surrounding the perimeter of the first and second flanges to seal the wafer stage chamber assembly.

A third aspect of the present invention is a wafer stage chamber assembly of a photolithography system for manufacturing semiconductor substrates. The wafer stage chamber assembly comprises a chamber portion having a first flange surrounding a perimeter of the chamber portion, and a top wall having a second flange surrounding a perimeter of the top wall. The second flange has a plurality of openings. The wafer stage chamber assembly also comprises a plurality of pins aligned on the first flange for insertion into the plurality of openings on the second flange. Each of the plurality of pins has a pinhead. Further, the wafer stage chamber assembly comprises at least one keyhole strip for insertion into at least a portion of the plurality of pinheads to slidably lock the plurality of pins fastening at least a portion of the first and second flanges to construct the wafer stage chamber assembly, and an o-ring seal positioned in between and surrounding the perimeter of the first and second flanges to seal the wafer stage chamber assembly.

A fourth aspect of the present invention is a wafer stage chamber assembly of a photolithography system for manufacturing semiconductor substrates. The wafer stage chamber assembly comprises a chamber portion having a first flange surrounding a perimeter of the chamber portion, and a top wall having a second flange surrounding a perimeter of the top wall. The wafer stage chamber assembly also comprises at least one clamp channel to fasten at least a portion of the perimeter of the first flange with a corresponding portion of the second flange, and at least one o-ring seal positioned in between and surrounding the perimeter of the first and second flanges to seal the wafer stage chamber assembly.

A fifth aspect of the present invention is a wafer stage chamber assembly of a photolithography system for manufacturing semiconductor substrates. The wafer stage chamber assembly comprises a chamber portion having a U-shaped clamp surrounding a perimeter of the chamber portion, and a top wall having a flange surrounding a perimeter of the top wall. The flange is fitted for engagement with the U-shaped clamp. The wafer stage chamber assembly also comprises at least one o-ring seal positioned between one leg of the U-shaped clamp and the flange surrounding the perimeter of the chamber portion and the top wall to seal the wafer stage chamber assembly.

It is to be understood that both the foregoing general description and the following detailed description are exemplary and explanatory only and are not restrictive of the invention as claimed. Additional advantages will be set forth in the description which follows, and in part will be understood from the description, or may be learned by practice of the invention. The advantages and purposes may be obtained by means of the combinations set forth in the attached claims.

BRIEF DESCRIPTION OF THE DRAWINGS

The accompanying drawings, which are incorporated in and constitute a part of this specification, illustrate several embodiments of the invention and, together with the description, serve to explain the principles of the invention. In the drawings.

FIGS. 4A–4D are schematic cross-sectional views of variously shaped inflatable o-ring seals that can be utilized with the chamber seal device consistent with the principles of the present invention;

DESCRIPTION OF THE INVENTION

Reference will now be made in detail to an embodiment of the apparatus, system, and method consistent with the principles of the present invention, examples of which are illustrated in the accompanying drawings. The invention will be further clarified by the following examples, which are intended to be exemplary of the invention.

The device consistent with the principles of the present invention is useful to isolate semiconductor substrates, the wafer stage device, and the process of making thereof from the atmospheric condition so that the resulted semiconductor wafers meet certain wafer manufacturing specifications and obtain the specified quality standards. The principles of this invention are similarly applicable to other parts of the photolithography system. Thus, this invention is not limited to any particular application. Rather, the device disclosed herein could be used in any system configured to embody similarly disclosed elements which require a chamber to isolate the sensitive and accurately aligned assembly or device therein.

Figure 1:
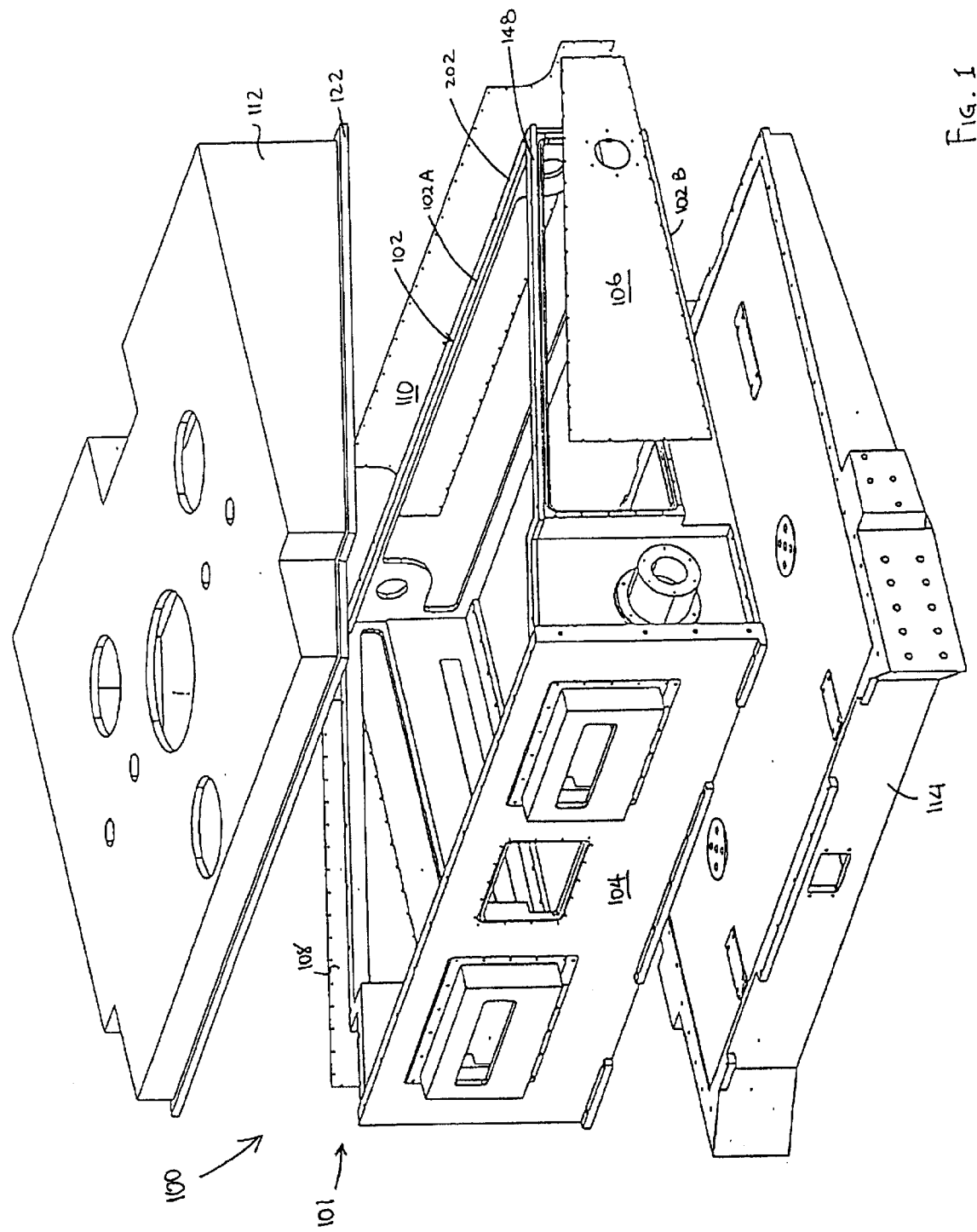
FIG. 1 is an exploded perspective frontal view of a wafer stage chamber assembly consistent with the principles of the present invention.
Figure 2:
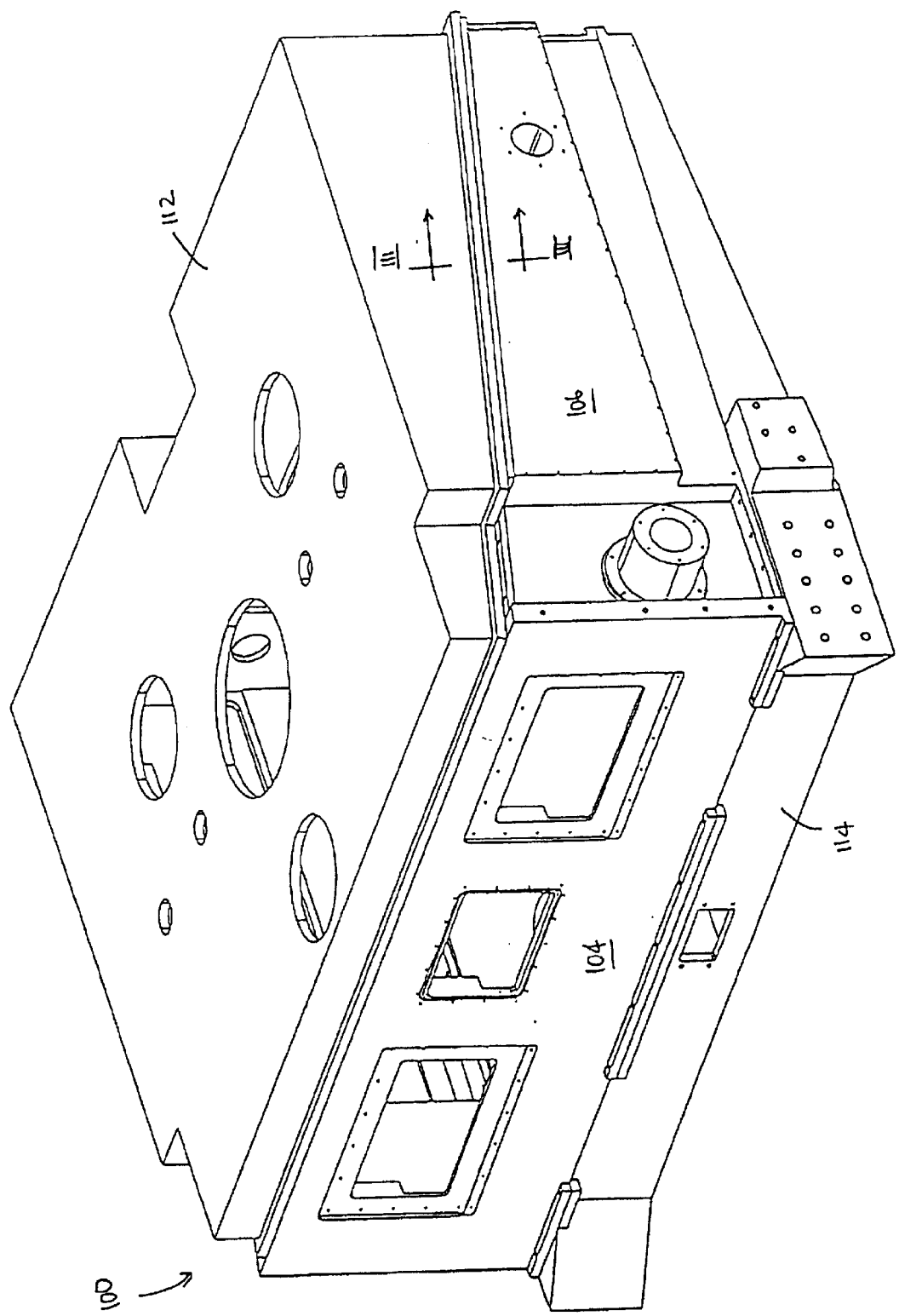
FIG. 2 is a perspective frontal view of the wafer stage chamber assembly consistent with the principles of the present invention.

As illustrated in FIGS. 1 and 2, a wafer stage chamber assembly 100 for use in manufacturing semiconductor substrates comprises a chamber frame 102 to enclose a wafer stage device 66 (shown in FIG. 8), and a plurality of chamber walls or panels 104, 106, 108, 110, attached to the chamber frame. Chamber frame 102 and chamber walls 104, 106, 108, and 110 construct a chamber portion 101. Wafer stage chamber assembly 100 also comprises a top wall 112 and a base frame 114 attached to the top and bottom sides 102A and 102B, respectively, of chamber frame 102. Chamber frame 102 has a first flange 148 surrounding an upper perimeter thereof. Similarly, top wall 112 has a second flange 122, corresponding and to interface with first flange 148, surrounding a perimeter of top wall 112. Detail of wafer stage chamber assembly 100 is disclosed in U.S. patent application Ser. No. 09/759,218, filed Jan. 16, 2001, the entire disclosure of which is incorporated by reference.

A chamber seal device consistent with the principles of the present invention includes various embodiments. Each embodiment is designed to seal wafer stage chamber assembly 100 with considerations including a simple and quick mechanism to assemble and disassemble wafer stage chamber assembly 100, and a limited access for an operator to assemble and seal wafer stage chamber assembly 100.

Figures 3A, 3B:
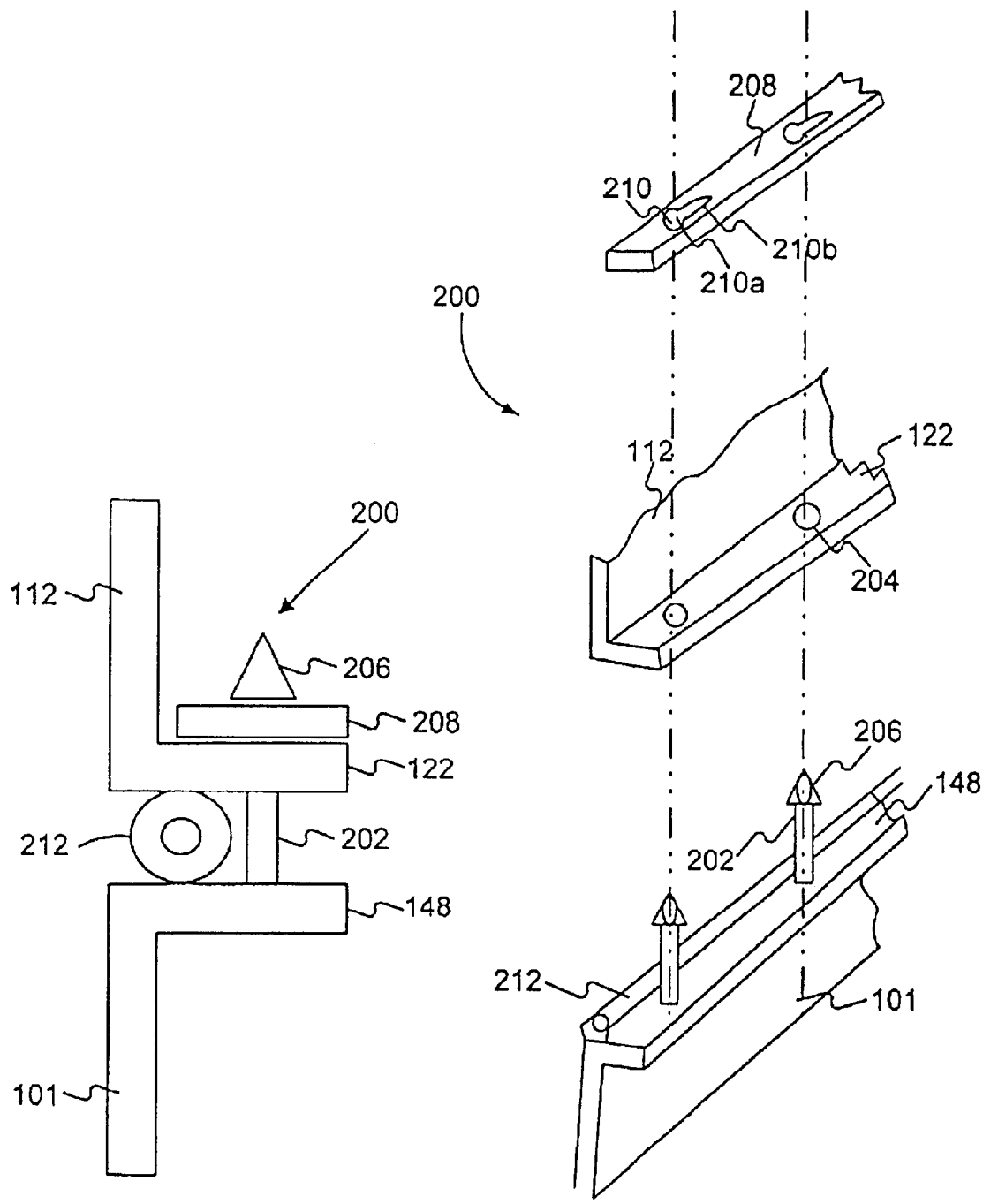
FIG. 3A is a cross-sectioned view of a chamber seal device according to a first embodiment of the present invention taken from line III—III of FIG. 2.
FIG. 3B is an exploded perspective view of the chamber seal device according to the first embodiment of the present invention.

A chamber seal device 200 according to a first embodiment of the present invention, as illustrated in FIGS. 3A and 3B, includes a plurality of pins 202 aligned on first flange 148 surrounding the perimeter of chamber portion 101 for insertion into a corresponding plurality of openings 204 provided on second flange 122 surrounding the perimeter of top wall 112. Each of pins 202 has a pinhead 206. The diameter of pinhead 206 is preferably larger than the diameter of pin 202, but smaller than the diameter of the corresponding opening 204. Pinheads 206 may be tapered to facilitate alignment with the matching openings 204. The plurality of pins 202 may be made an integral part of first flange 148, or alternatively, separate parts attached to first flange 148. The plurality of pins 202 may have any sectional configuration, such as circular, square, or hexagonal, as long as the corresponding plurality of openings 204 have a corresponding sectional configuration.

The chamber seal device 200 according to the first embodiment also includes at least one keyhole strip 208 for insertion over at least a portion of pinheads 206 to slidably lock pins 202 and to fasten at least a portion of first and second flanges 148, 122, respectively. Each keyhole strip 208 may be an elongated plate having a plurality of keyholes 210, the interval of which corresponding to the plurality of pins 204 and matching openings 206. Keyhole strips 208 may be made of any strong metal, such as steel, cast iron, or aluminum.

Each keyhole 210 may be a combination of a hole 210*a* and an elongated keyway 210*b*, as illustrated in FIG. 3B. Hole 210*a* has a diameter sufficient to receive pinhead 206 and preferably has the same configuration as pin 202 and opening 204. Keyway 210*b* has sufficient width to receive the diameter of pin 202. Thus, once first and second flanges 148, 122, respectively, are connected via the matching pins 202 and openings 204, the hole portions 210*a* of keyhole strip 208 may be placed over pinheads 206 and then slid so that pins 202 enter keyway portion 210*b* to lock first and second flanges 148, 122, respectively.

The chamber seal device 200 according to the first embodiment also includes an o-ring seal 212 positioned in between and surrounding the perimeter of first and second flanges 148, 122, respectively to seal wafer stage chamber assembly 100. O-ring seal 212 is inflatable to press against both chamber portion 101 and top wall 112 to create a sealing engagement of wafer stage chamber assembly 100. O-ring seal 212 may be a rubber hose having sufficient strength to withstand a pressurized condition inside wafer stage chamber assembly 100. FIG. 4A illustrates o-ring seal 212 in both a deflated and inflated state. FIGS. 4B and 4C illustrate various sections of o-ring seals 212 which have planar portions 212*a* for fastening o-ring seals 212 to either the first or second flange 148 or 122, respectively. O-ring seals 212 illustrated in FIGS. 4A–4C are commercially available and referred to in the relevant industry as Pneuma-Seal. FIG. 4D illustrates an o-ring seal 212 made of a combination of materials, for example, an inner layer 212*b* of polyethylene (PE) to allow glue joint 212*c* on opposing edges thereof and an outer laminate layer 212*d* of Eval to prevent contamination inside wafer stage chamber assembly 100.

In operation, for example, wafer stage chamber assembly 100 illustrated in FIGS. 1 and 2 has a front shear panel 104, a pair of side panels 106 and 108, and a rear panel 110. Each panel has a first flange 148 on upper side 102A of chamber frame 102 interfacing with a corresponding sealing (or second) flange 122 on the lower side of top wall 112. First flange 148 has a plurality of pins 202, shown as dots, surrounding the perimeter of upper sides 102A of front shear panel 104, side panels 106, 108, and rear panel 110. In the illustrated embodiment, the matching openings 204 (not shown in FIG. 1) are provided on sealing (second) flange 122 on the lower side of top wall 112.

Figure 8:
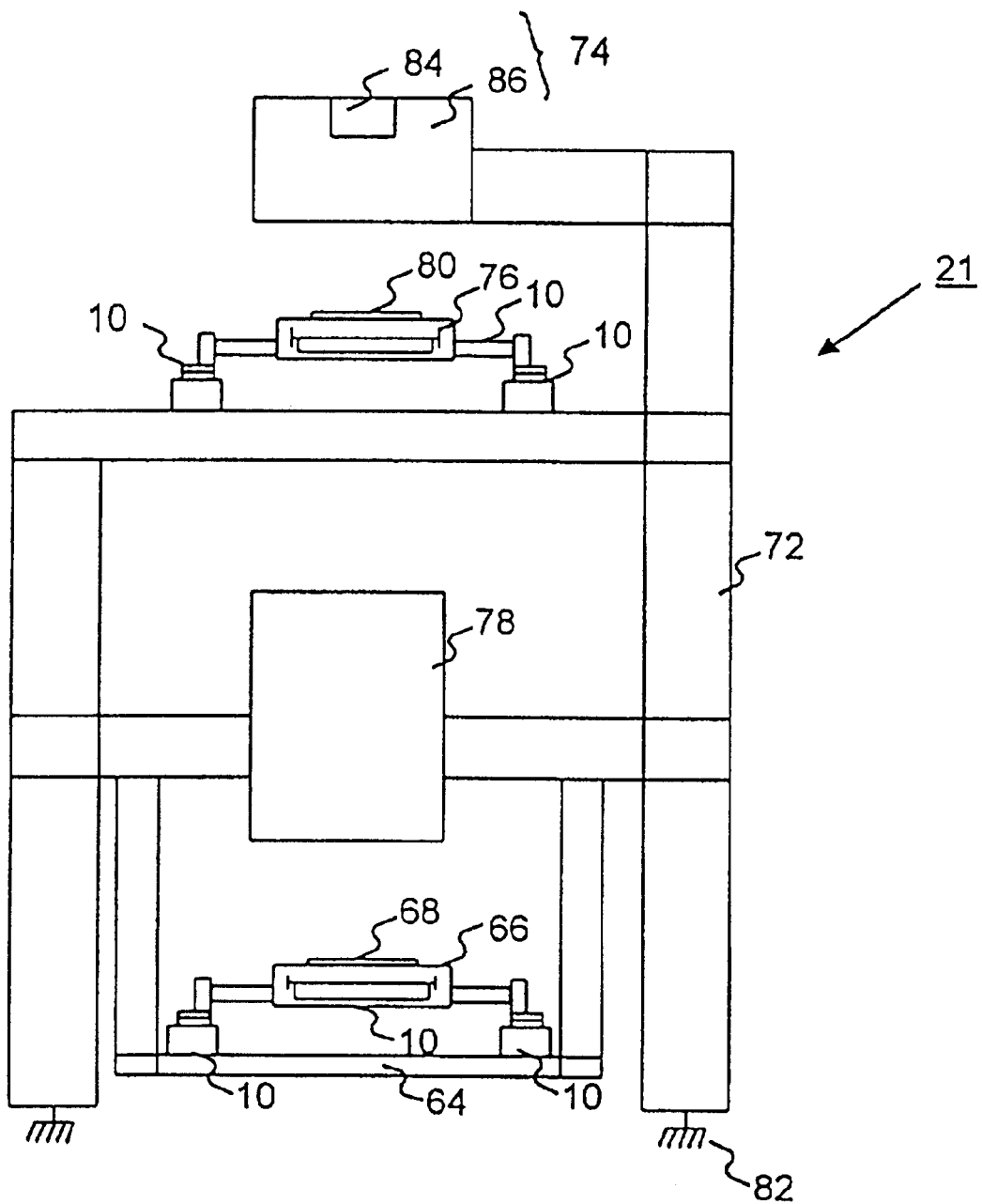
FIG. 8 is an elevation of an exposure apparatus having a wafer stage assembly.

When wafer stage chamber assembly 100 is in a disassembled state, top wall 112 is commonly attached to an apparatus frame 72 of an exposure apparatus 21 illustrated in FIG. 8. To assemble wafer stage chamber assembly 100, the chamber portion 101 is raised up to align pins 202 on the upper perimeter thereof with openings 204 of the lower perimeter of top wall 112.

In the illustrated wafer stage chamber assembly 100 of FIGS. 1 and 2, four keyhole strips 208 may be provided; one along the upper side of front shear panel 104, two along the upper sides of side panels 106 and 108, and one along the upper side of rear panel 110. After all of the plurality of pins 202 on chamber portion 101 are inserted into the plurality of openings 204 on top wall 112, each keyhole strip 208 may be placed over sealing (second) flange 122 inserting holes 204 over pinheads 206, and sliding keyhole strip 208 so that pins 202 are locked in keyways 210.

Once chamber portion 101 and top wall 112 are locked in place by keyhole strips 208, o-ring seal 212 is inflated to press against both chamber portion 101 and top wall 112 creating a tight seal inside wafer stage chamber assembly 100.

Figure 5:
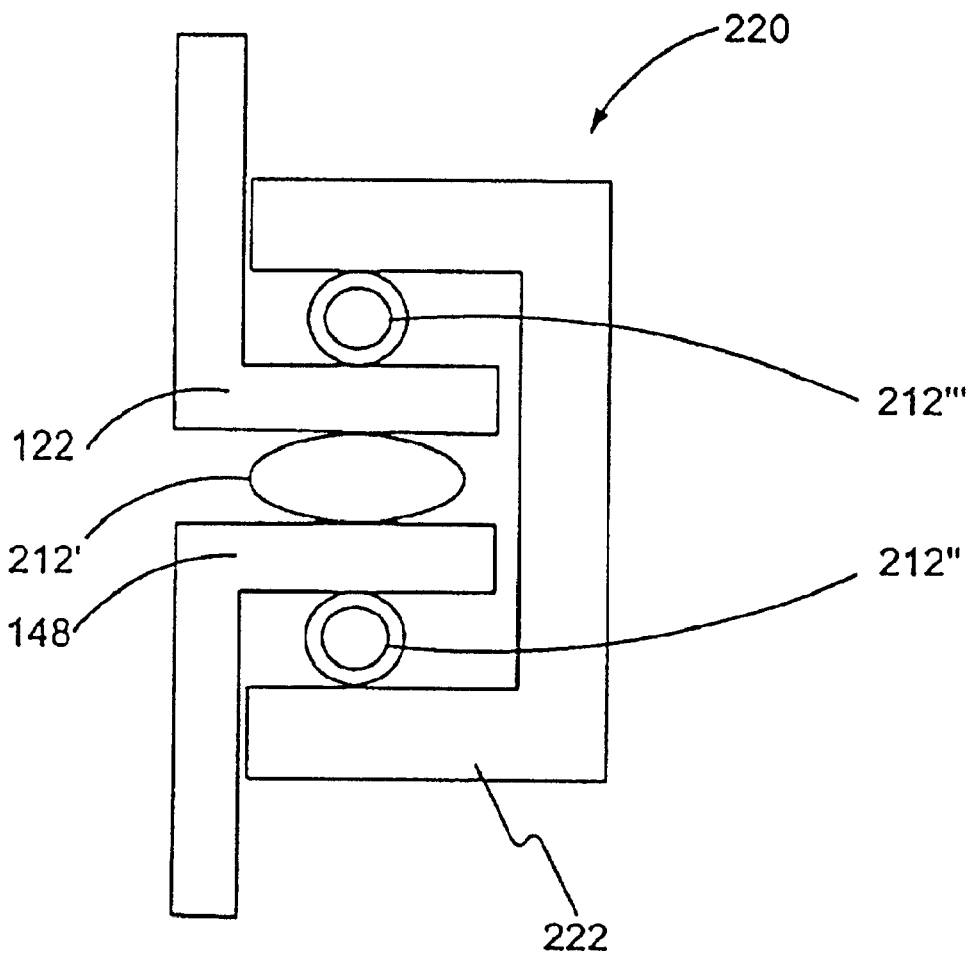
FIG. 5 is a section view of a chamber seal device according to a second embodiment of the present invention.

A chamber seal device 220 according to a second embodiment of the present invention, as illustrated in FIG. 5, includes at least one clamp channel 222 and at least one o-ring seal 212 to seal wafer stage chamber assembly 100. Each clamp channel 222, having a C-shaped channel, fastens at least a portion of a perimeter of first flange 148 of chamber portion 101 with a corresponding portion of second flange 122 of top wall 112. Thus, C-shaped channel 222 provides a distributed clamping force around the perimeter of wafer stage chamber assembly 100.

O-ring seals 212 may be made of a material that is commercially known as Viton. O-ring seals 212 may also be made of the materials and have configurations as previously discussed with respect to the first embodiment.

In the embodiment illustrated in FIG. 5, three o-ring seals 212 are provided; a first o-ring seal 212' positioned between first and second flanges 148, 122, respectively, a second 212" positioned between first flange 148 and one leg of clamp channel 222, and a third 212'" positioned between second flange 122 and another leg of clamp channel 222. Alternatively, first o-ring seal 212' may be replaced with a gasket. First o-ring seal 212' may be provided on the upper perimeter of first flange 148 of chamber portion 101. A corresponding groove (not shown) may be provided on the lower perimeter of second flange 122 of top wall 112. A reverse configuration is possible. Similarly, second o-ring seal 212", in a deflated state, may be provided either on the lower perimeter of first flange 148 of chamber portion 101 or an inner perimeter of the lower leg of C-shaped channel 222. Likewise, third o-ring seal 212'" in a deflated state, may be provided either on the upper perimeter of second flange 122 of top wall 112 or an inner perimeter of the upper leg of C-shaped channel 222.

In operation, to assemble wafer stage chamber assembly 100, the chamber portion 101 is raised to interface with top wall 112. No pin-and-opening alignment, such as shown with respect to the first embodiment, is needed. Then each of C-shaped clamp channels 222 is placed sandwiching first and second flanges 148, 122, respectively. For wafer stage chamber assembly 100 illustrated in FIGS. 1 and 2, four C-shaped clamp channels 222 may be provided; one for sandwiching the portions of first and second flanges 148, 122, respectively along front shear panel 104, two for sandwiching the portions of first and second flanges 148, 122, respectively along side panels 106 and 108, and one for sandwiching the portions of first and second flanges 148, 122, respectively along rear panel 110. Once all clamp channels 222 have been assembled, each one of o-ring seals 212', 212", and 212'" may be inflated to seal wafer stage chamber assembly 100.

Figure 6:
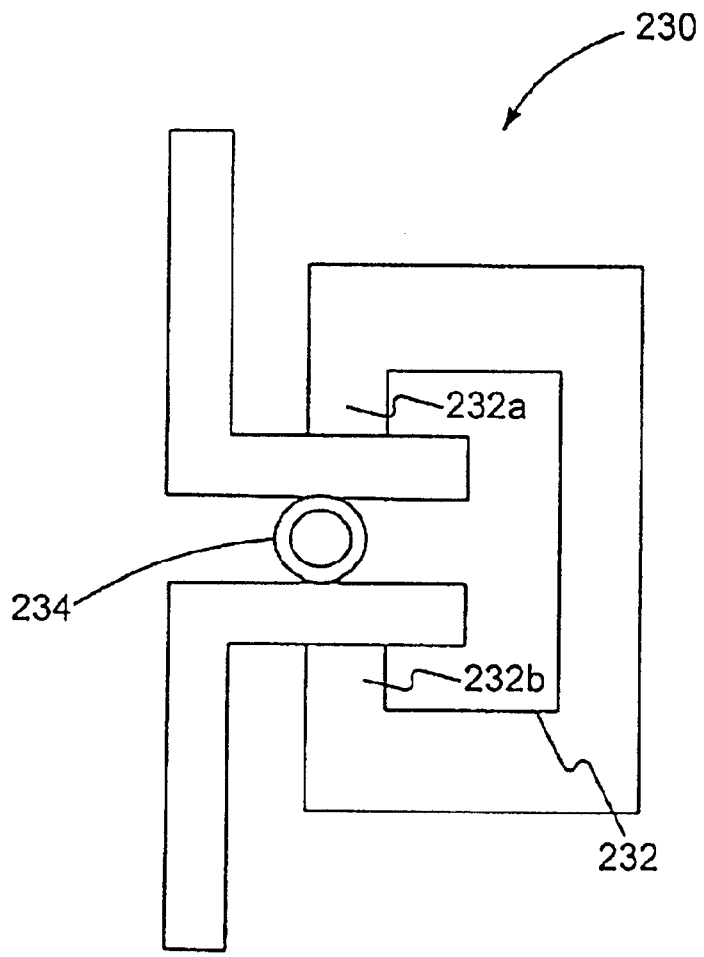
FIG. 6 is a section view of a chamber seal device according to a third embodiment of the present invention.

An alternate embodiment to those shown in FIG. 5 is the third embodiment of the chamber seal device 230, shown in FIG. 6. Chamber seal device 230 according to the third embodiment includes at least one clamp channel 232 and one o-ring seal 234 positioned in between and surrounding the perimeter of first and second flanges 148, 122, respectively to seal wafer stage chamber assembly 100. Each clamp channel 232 also has C-shaped channel, but preferably is a hard C-shaped clamp channel, i.e., having nipping ends 232*a*, 232*b* to sandwich first and second flanges 148, 122, respectively. In this embodiment, the joint stiffness between chamber portion 101 and top wall 112 is determined by the stiffness of C-shaped clamp 232. Inflatable o-ring 234 preloads first and second flanges 148, 122, respectively outward against C-shaped clamp 232. Note that in the event inflatable o-ring seal 234 loses its pressure, top wall 112 and other parts of the upper chamber will compress deflated o-ring seal 234 and maintain some sealing engagement between first and second flanges 148, 122, respectively.

As can be understood from the drawings, chamber seal device 230 according to the third embodiment operates in a similar fashion as chamber seal device 220 according to the second embodiment.

Figure 7:
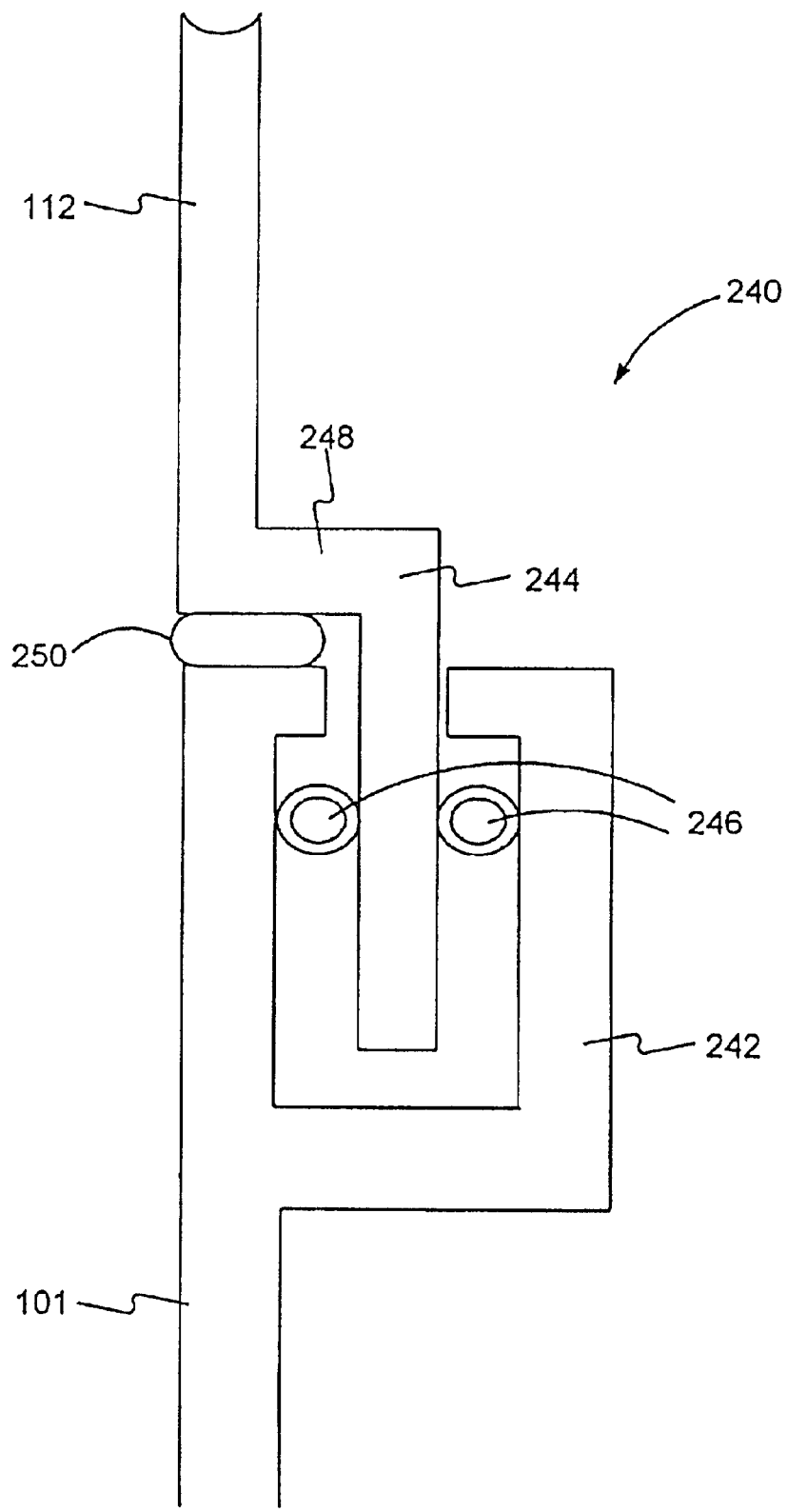
FIG. 7 is a section view of a chamber seal device according to a fourth embodiment of the present invention.

A chamber seal device 240 according to a fourth embodiment of the present invention, as illustrated in FIG. 7, is incorporated with wafer stage chamber assembly 100. Wafer stage chamber assembly 100 includes a chamber portion 101 having a U-shaped clamp 242 surrounding a perimeter of chamber portion 101, and a top wall 112 having a vertical flange 244 surrounding a perimeter of top wall 112. Vertical flange 244 is fitted for engagement with U-shaped clamp 242. In addition, wafer stage chamber assembly 100 includes at least one o-ring seal 246 positioned between one leg of U-shaped clamp 242 and vertical flange 244 surrounding the perimeter of the chamber portion and the top wall to seal the wafer stage chamber assembly.

In the illustrated embodiment, two o-ring seals 246 are provided on the inner sides of the two legs of U-shaped clamp 242. When inflated the two o-ring seals 246 pinch vertical flange 244 between U-shaped clamp 242 to create a seal. Top wall 112 may have a step 248 abutting vertical flange 244 so that top wall 112 makes a stiff mechanical contact with chamber portion 101. A gasket or another inflatable o-ring seal 250 may be provided to cushion and seal the step portion.

Alternatively, this invention anticipates that one o-ring seal 246 may be sufficient, the o-ring seal provided to press vertical flange 244 of top wall 112 against either one of the two legs of U-shaped clamp 242 to seal wafer stage chamber assembly 100.

As can be understood from the drawings, the chamber seal device according to the fourth embodiment operates as follows. To assembly wafer stage chamber assembly 100, chamber portion 101 is raised up fitting vertical flange 244 of top wall 112 into U-shaped clamp 242 around the perimeter of chamber portion 101. Then, at least one o-ring seal 242 is inflated to create a sealing engagement between chamber portion 101 and top wall 112, thus constructing wafer stage chamber assembly 100.

FIG. 8 illustrates a wafer stage 66 without wafer stage chamber assembly 100 attached to an exposure apparatus 21 of a photolithography system to manufacture semiconductor wafers 68. The wafer stage chamber assembly and chamber seal device consistent with the principles of the present invention are not shown. Wafer stage 66 positions the semiconductor wafer 68 as wafer stage 66 is being accelerated by a stage force (not shown) generated in response to a wafer manufacturing control system (not shown). The wafer manufacturing control system is the central computerized control system executing the wafer manufacturing process. To permit smaller and more intricate circuit pattern, projection lens assembly 78 must accurately focus the energy beam to align the overlay of circuit patterns of the multi-layered integrated circuit.

An apparatus frame 72 supports projection lens assembly 78. In operation, exposure apparatus 21 transfers a pattern of an integrated circuit from reticle 80 onto semiconductor wafer 68. Exposure apparatus 21 can be mounted to a base 82, i.e., the ground or via a vibration isolation system (not shown). Apparatus frame 72 is rigid and supports the components of exposure apparatus 21, including reticle stage 76, wafer stage 66, lens assembly 78, and illumination system 74.

Illumination system 74 includes an illumination source 84 to emit a beam of light energy. Illumination system 74 also includes an illumination optical assembly 86 to guide the beam of light energy from illumination source 84 to lens assembly 78. The beam selectively illuminates different portions of reticle 80 and exposes wafer 68.

Lens assembly 78 projects and/or focuses the light passing through reticle 80 to wafer 68. Lens assembly 78 may magnify or reduce the image illuminated on reticle 80. Lens assembly 78 may also be a 1× magnification system.

Reticle stage 76 holds and positions reticle 80 relative to lens assembly 78 and wafer 68. Similarly, wafer stage 66 holds and positions wafer 68 with respect to the projected image of the illuminated portions of reticle 80. Wafer stage 66 and reticle stage 76 are moved by a plurality of motors 10.

There are several different types of photolithography systems, including a scanning type and a step-and-repeat type. In the scanning type photolithography system, illumination system 74 exposes the pattern from reticle 80 onto wafer 68 with reticle 80 and wafer 68 moving synchronously. Reticle stage 76 moves reticle 80 on a plane which is generally perpendicular to an optical axis of lens assembly 78, while wafer stage 66 moves wafer 68 on another plane generally perpendicular to the optical axis of lens assembly 78. Scanning of reticle 80 and wafer 68 occurs while reticle 80 and wafer 68 are moving synchronously.

Alternately, in the step-and-repeat type photolithography system, illumination system 74 exposes reticle 80 while reticle 80 and wafer 68 are stationary. Wafer 68 is in a constant position relative to reticle 80 and lens assembly 78 during the exposure of an individual field. Subsequently, between consecutive exposure steps, wafer 68 is consecutively moved by wafer stage 66 perpendicular to the optical axis of lens assembly 78 so that the next field of semiconductor wafer 68 is brought into position relative to lens assembly 78 and reticle 80 for exposure. Following this process, the images on reticle 80 are sequentially exposed onto the fields of wafer 68.

The use of exposure apparatus 21 provided herein is not limited to a photolithography system for a semiconductor manufacturing. Exposure apparatus 21, for example, can be used as an LCD photolithography system that exposes a liquid crystal display device pattern onto a rectangular glass plate or a photolithography system for manufacturing a thin film magnetic head. Further, the present invention can also be applied to a proximity photolithography system that exposes a mask pattern by closely locating a mask and a substrate without the use of a lens assembly. Additionally, the present invention provided herein can be used in other devices, including other semiconductor processing equipment, machine tools, metal cutting machines, and inspection machines.

The illumination source 84 can be g-line (436 nm), i-line (365 nm), KrF excimer laser (248 nm), ArF excimer laser (193 nm) and $F_2$ laser (157 nm). Alternatively, illumination source 84 can also use charged particle beams such as x-ray and electron beam. For instance, in the case where an electron beam is used, thermionic emission type lanthanum hexaboride ($LaB_6$) or tantalum (Ta) can be used as an electron gun. Furthermore, in the case where an electron beam is used, the structure could be such that either a mask is used or a pattern can be directly formed on a substrate without the use of a mask.

With respect to lens assembly 78, when far ultra-violet rays such as the excimer laser is used, glass materials such as quartz and fluorite that transmit far ultra-violet rays is preferably used. When the $F_2$ type laser or x-ray is used, lens assembly 78 should preferably be either catadioptric or refractive (a reticle should also preferably be a reflective type), and when an electron beam is used, electron optics should preferably comprise electron lenses and deflectors. The optical path for the electron beams should be in a vacuum.

Also, with an exposure device that employs vacuum ultra-violet radiation (VUV) of wavelength 200 nm or lower, use of the catadioptric type optical system can be considered. Examples of the catadioptric type of optical system include the disclosure Japan Patent Application Disclosure No. 8-171054 published in the Official Gazette for Laid-Open Patent Applications and its counterpart U.S. Pat. No, 5,668,672, as well as Japan Patent Application Disclosure No. 10-20195 and its counterpart U.S. Pat. No. 5,835,275. In these cases, the reflecting optical device can be a catadioptric optical system incorporating a beam splitter and concave mirror. Japan Patent Application Disclosure No. 8-334695 published in the Official Gazette for Laid-Open Patent Applications and its counterpart U.S. Pat. No. 5,689,377 as wall as Japan Patent Application Disclosure No. 10-3039 and its counterpart U.S. patent application Ser. No. 873,606 (Application Date: Jun. 12, 1997) also use a reflecting-refracting type of optical system incorporating a concave mirror, etc., but without a beam splitter, and can also be employed with this invention. The disclosures in the above-mentioned U.S. patents, as well as the Japan patent applications published in the Official Gazette for Laid-Open Patent Applications are incorporated herein by reference.

Further, in photolithography systems, when linear motors (see U.S. Pat. Nos. 5,623,853 or 5,528,118) are used in a wafer stage or a reticle stage, the linear motors can be either an air levitation type employing air bearings or a magnetic levitation type using Lorentz force or reactance force. Additionally, the stage could move along a guide, or it could be a guideless type stage which uses no guide. The disclosures in U.S. Pat. Nos. 5,623,853 and 5,528,118 are incorporated herein by reference.

Alternatively, one of the stages could be driven by a planar motor, which drives the stage by electromagnetic force generated by a magnet unit having two-dimensionally arranged magnets and an armature coil unit having two-dimensionally arranged coils in facing positions. With this type of driving system, either one of the magnet unit or the armature coil unit is connected to the stage and the other unit is mounted on the moving plane side of the stage.

Movement of the stages as described above generates reaction forces which can affect performance of the photolithography system. Reaction forces generated by the wafer (substrate) stage motion can be released mechanically to the floor (ground) by use of a frame member as described in U.S. Pat. No. 5,528,118 and published Japanese Patent Application Disclosure No. 8-166475. Additionally, reaction forces generated by the reticle (mask) stage motion can be mechanically released to the floor (ground) by use of a frame member as described in U.S. Pat. No. 5,874,820 and published Japanese Patent Application Disclosure No. 8-330224. The disclosures in U.S. Pat. Nos. 5,528,118 and 5,874,820 and Japanese Patent Application Disclosure No. 8-330224 are incorporated herein by reference.

This invention is not limited to use for the chamber assembly that isolates the wafer stage device from the atmospheric condition as described in embodiments. We can use this invention to isolate the reticle (mask) stage device from the atmospheric condition. Similarity, we can use this invention to isolate the projection optical system from the atmospheric condition.

As described above, a photolithography system according to the above described embodiments can be built by assembling various subsystems, including each element listed in the appended claims, in such a manner that prescribed mechanical accuracy, electrical accuracy and optical accuracy are maintained. In order to maintain the various accuracies, prior to and following assembly, every optical system is adjusted to achieve its optical accuracy. Similarly, every mechanical system and every electrical system are adjusted to achieve their respective mechanical and electrical accuracies. The process of assembling each subsystem into a photolithography system includes mechanical interfaces, electrical circuit wiring connections and air pressure plumbing connections between each subsystem. Needless to say, there is also a process where each subsystem is assembled prior to assembling a photolithography system from the various subsystems. Once a photolithography system is assembled using the various subsystems, total adjustment is performed to make sure that every accuracy is maintained in the complete photolithography system. Additionally, it is desirable to manufacture an exposure system in a clean room where the temperature and purity are controlled.

Figure 9:
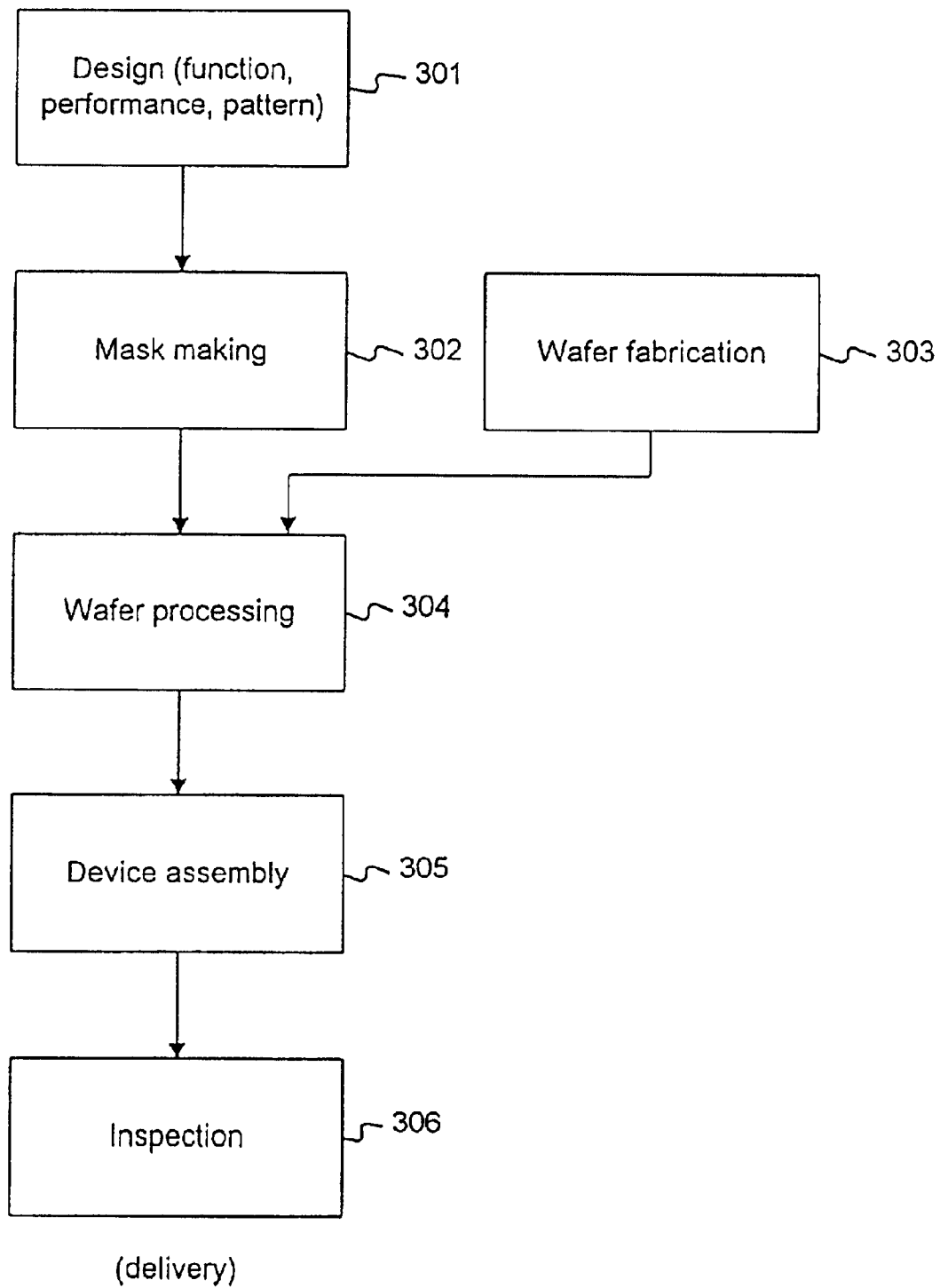
FIG. 9 is a flow chart outlining a process for manufacturing a semiconductor wafer consistent with the principles of the present invention.

Further, semiconductor devices can be fabricated using the above described systems, by the process shown generally in FIG. 9. In step 301 the device's function and performance characteristics are designed. Next, in step 302, a mask (reticle) having a pattern is designed according to the previous designing step, and in a parallel step 303, a wafer is made from a silicon material. The mask pattern designed in step 302 is exposed onto the wafer from step 303 in step 304 by a photolithography system described hereinabove consistent with the principles of the present invention. In step 305 the semiconductor device is assembled (including the dicing process, bonding process and packaging process), then finally the device is inspected in step 306.

Figure 10:
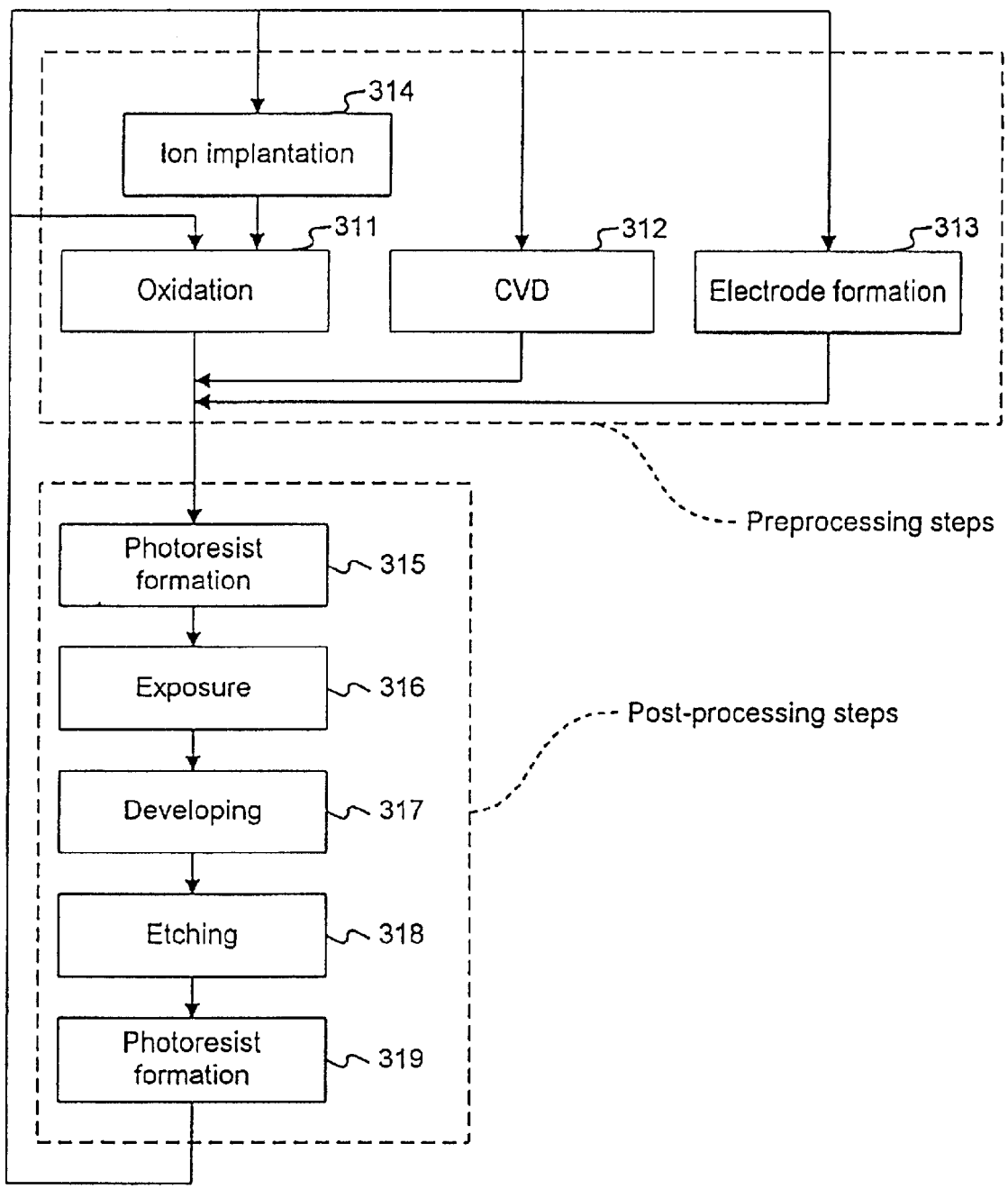
FIG. 10 is a flow chart outlining the semiconductor manufacturing process in further detail.

FIG. 10 illustrates a detailed flowchart example of the above-mentioned step 304 in the case of fabricating semiconductor devices. In step 311 (oxidation step), the wafer surface is oxidized. In step 312 (CVD step), an insulation film is formed on the wafer surface. In step 313 (electrode formation step), electrodes are formed on the wafer by vapor deposition. In step 314 (ion implantation step), ions are implanted In the wafer. The above mentioned steps 311–314 form the preprocessing steps for wafers during wafer processing, and selection is made at each step according to processing requirements.

At each stage of wafer processing, when the above-mentioned preprocessing steps have been completed, the following post-processing steps are implemented. During post-processing, initially, in step 315 (photoresist formation step), photoresist is applied to a wafer. Next, in step 316, (exposure step), the above-mentioned exposure device is used to transfer the circuit pattern of a mask (reticle) to a wafer. Then, in step 317 (developing step), the exposed wafer is developed, and in step 318 (etching step), parts other than residual photoresist (exposed material surface) are removed by etching. In step 319 (photoresist removal step), unnecessary photoresist remaining after etching is removed.

Multiple circuit patterns are formed by repetition of these preprocessing and post-processing steps.

It will be apparent to those skilled in the art that various modifications and variations can be made in the sub-assembly, the expandable support, the removal support, and the methods described, the material chosen for the present invention, and in construction of the sub-assembly, the main assembly, the photolithography systems as well as other aspects of the invention without departing from the scope or spirit of the invention.

Other embodiments of the invention will be apparent to those skilled in the art from consideration of the specification and practice of the invention disclosed herein. It is intended that the specification and examples be considered as exemplary only, with a true scope and spirit of the invention being indicated by the following claims and their equivalents.

What is claimed is:

1. A chamber seal device for sealing a wafer stage chamber assembly of a photolithography system for manufacturing semiconductor substrates, the wafer stage chamber assembly having a first portion and a second portion, the chamber seal device comprising:

a plurality of pins aligned on a first flange surrounding a perimeter of the first portion for insertion into a corresponding plurality of openings on a second flange surrounding a perimeter of the second portion, each of the plurality of pins having a pinhead;

at least one keyhole strip for insertion into at least a portion of the plurality of pinheads to slidably lock the plurality of pins fastening at least a portion of the first and second flanges to construct the wafer stage chamber assembly; and an o-ring seal positioned in between and surrounding the perimeter of the first and second flanges to seal the wafer stage chamber assembly.

2. The chamber seal device of claim 1, wherein the o-ring seal is inflatable to press the first portion against the second portion creating a sealing engagement of the wafer stage chamber assembly.

3. A photolithography system comprising the chamber seal device of claim 1.

4. A chamber seal device for sealing a wafer stage chamber assembly of a photolithography system for manufacturing semiconductor substrates, the wafer stage chamber assembly having a first portion and a second portion, the chamber seal device comprising:

at least one clamp channel to fasten at least a portion of a perimeter of a first flange of the first portion with a corresponding portion of a second flange of the second portion; and at least one o-ring seal positioned in between and surrounding the perimeter of the first and second flanges to seal the wafer stage chamber assembly.

5. The chamber seal device of claim 4, wherein the at least one o-ring seal is inflatable to create a sealing engagement of the wafer stage chamber assembly.

6. A photolithography system comprising the chamber seal device of claim 4.

7. A wafer stage chamber assembly of a photolithography system for manufacturing semiconductor substrates, comprising:

a chamber portion having a first flange surrounding a perimeter of the chamber portion;

a top wall having a second flange surrounding a perimeter of the top wall, the second flange having a plurality of openings;

a plurality of pins aligned on the first flange for insertion into the plurality of openings on the second flange, each of the plurality of pins having a pinhead;

at least one keyhole strip for insertion into at least a portion of the plurality of pinheads to slidably lock the plurality of pins fastening at least a portion of the first and second flanges to construct the wafer stage chamber assembly; and an o-ring seal positioned in between and surrounding the perimeter of the first and second flanges to seal the wafer stage chamber assembly.

8. The wafer stage chamber assembly of claim 7, wherein the o-ring seal is inflatable to press the chamber portion against and the top wall creating a sealing engagement of the wafer stage chamber assembly.

9. A photolithography system comprising the wafer stage chamber assembly of claim 7.

10. A wafer stage chamber assembly of a photolithography system for manufacturing semiconductor substrates, comprising:

a chamber portion having a first flange surrounding a perimeter of the chamber portion;

a top wall having a second flange surrounding a perimeter of the top wall;

at least one clamp channel to fasten at least a portion of the perimeter of the first flange with a corresponding portion of the second flange; and at least one o-ring seal positioned in between and surrounding the perimeter of the first and second flanges to seal the wafer stage chamber assembly.

11. The wafer stage chamber assembly of claim 10, wherein the at least one o-ring seal is inflatable to press the chamber portion against and the top wall creating a sealing engagement of the wafer stage chamber assembly.

12. A photolithography system comprising the wafer stage chamber assembly of claim 10.

13. A wafer stage chamber assembly of a photolithography system for manufacturing semiconductor substrates, comprising:

a chamber portion having a U-shaped clamp surrounding a perimeter of the chamber portion;

a top wall having a flange surrounding a perimeter of the top wall, the flange fitted for engagement with the U-shaped clamp;

at least one o-ring seal positioned between one leg of the U-shaped clamp and the flange surrounding the perimeter of the chamber portion and the top wall to seal the wafer stage chamber assembly.

14. A photolithography system comprising the wafer stage chamber assembly of claim 13.

15. A chamber seal device that seals a chamber assembly, the chamber assembly having a first portion and a second portion, the chamber seal device comprising:

a connecting member that connects the first portion and the second portion, the connecting member having a first member attached to one of the first portion and the second portion, and a second member attached to one of other of the first portion and the second portion to slidably lock the first member; and a sealing member that contacts to at least one of the first portion and the second portion the sealing member including a pressing portion that creates a sealing engagement of the chamber after connecting the first portion and the second portion by the connecting member.

16. A stage assembly comprising the chamber assembly of claim 15.

17. An exposure apparatus comprising the stage assembly of claim 16.

18. An object on which said image has been formed by the exposure apparatus of claim 17.

19. A method for making a stage assembly, comprising:

providing a stage device;

making a chamber assembly having a first portion and a second portion, the method for making a chamber assembly comprising:

connecting the first portion and the second portion via a U-shaped connecting member; and disposing a sealing member that contacts to at least one of the first portion and the second portion so that a pressing portion of the sealing member creates a sealing engagement of the chamber after connecting the first portion and the second portion; and enclosing the stage device within the chamber assembly.

20. A method for making an exposure apparatus comprising the stage assembly made by utilizing the method of claim 19.

21. A method for making an object including at least the photolithography process, wherein the photolithography process uses the exposure apparatus made by utilizing the method of claim 20.

* * * * *